(12) United States Patent
Park et al.

(10) Patent No.: US 9,460,972 B2
(45) Date of Patent: Oct. 4, 2016

(54) SEMICONDUCTOR DEVICE AND METHOD OF FORMING REDUCED SURFACE ROUGHNESS IN MOLDED UNDERFILL FOR IMPROVED C-SAM INSPECTION

(71) Applicant: STATS ChipPAC, Ltd., Singapore (SG)

(72) Inventors: SeongWon Park, Kyoungki-do (KR); KiYoun Jang, Kyoungki-do (KR); KyungHoon Lee, Kyunggi-Do (KR); JaeHyun Lee, Kyunggi-Do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 13/720,516

(22) Filed: Dec. 19, 2012

(65) Prior Publication Data

US 2013/0175701 A1 Jul. 11, 2013

Related U.S. Application Data

(60) Provisional application No. 61/584,634, filed on Jan. 9, 2012.

(51) Int. Cl.
| | |
|---|---|
| *H01L 21/66* | (2006.01) |
| *H01L 23/31* | (2006.01) |
| *H01L 21/56* | (2006.01) |
| *H01L 23/00* | (2006.01) |

(52) U.S. Cl.
CPC ............. *H01L 22/12* (2013.01); *H01L 21/561* (2013.01); *H01L 21/566* (2013.01); *H01L 21/568* (2013.01); *H01L 23/31* (2013.01); *H01L 23/3128* (2013.01); *H01L 24/97* (2013.01); *H01L 2224/16225* (2013.01); *H01L 2224/97* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/1815* (2013.01)

(58) Field of Classification Search
USPC .................. 438/109, 613; 257/686, E23.069
See application file for complete search history.

(56) References Cited

U.S. PATENT DOCUMENTS

| | | | | |
|---|---|---|---|---|
| 6,765,801 B1 * | 7/2004 | Glenn et al. | ................... | 361/764 |
| RE39,957 E * | 12/2007 | Huang et al. | ................. | 438/106 |
| 7,642,133 B2 * | 1/2010 | Wu et al. | ...................... | 438/109 |

(Continued)

*Primary Examiner* — Bradley K Smith
*Assistant Examiner* — David Goodwin
(74) *Attorney, Agent, or Firm* — Robert D. Atkins; Patent Law Group: Atkins and Associates, P.C.

(57) ABSTRACT

A semiconductor device includes a semiconductor die. An interconnect structure is formed over an active surface of the semiconductor die. An encapsulant is formed over the semiconductor die and interconnect structure including a first surface opposite the interconnect structure. A peripheral portion of the first surface includes a first roughness disposed outside a footprint of the semiconductor die. A semiconductor die portion of the first surface includes a second roughness less than the first roughness disposed over the footprint of the semiconductor die. The first surface of the encapsulant is disposed within a mold and around the semiconductor die to contact a surface of the mold that includes a third roughness equal to the first roughness and a fourth roughness equal to the second roughness. The first roughness includes a roughness of less than 1.0 micrometers. The second roughness includes a roughness in a range of 1.2-1.8 micrometers.

16 Claims, 7 Drawing Sheets

(56) References Cited

U.S. PATENT DOCUMENTS

| | | | |
|---|---|---|---|
| 7,875,970 B2* | 1/2011 | Li | 257/706 |
| 8,058,101 B2* | 11/2011 | Haba et al. | 438/109 |
| 8,288,789 B2* | 10/2012 | Hung et al. | 257/98 |
| 8,304,285 B2* | 11/2012 | Gerber et al. | 438/108 |
| 8,546,183 B2* | 10/2013 | Huang et al. | 438/106 |
| 8,778,199 B2* | 7/2014 | Cornfeld et al. | 216/24 |
| 2008/0061451 A1* | 3/2008 | Huang et al. | 257/787 |
| 2008/0076208 A1* | 3/2008 | Wu | H01L 21/56 438/109 |
| 2008/0193747 A1* | 8/2008 | MacDonald | B29C 55/04 428/336 |
| 2008/0258289 A1* | 10/2008 | Pendse et al. | 257/690 |
| 2009/0085231 A1* | 4/2009 | Chiu et al. | 257/787 |
| 2010/0171205 A1* | 7/2010 | Chen | H01L 21/565 257/686 |
| 2011/0089454 A1* | 4/2011 | Xu | 257/98 |
| 2011/0304062 A1* | 12/2011 | Hsu | B29C 45/0055 257/787 |
| 2012/0119358 A1* | 5/2012 | Oh | 257/737 |
| 2012/0319286 A1* | 12/2012 | Yang et al. | 257/773 |

* cited by examiner

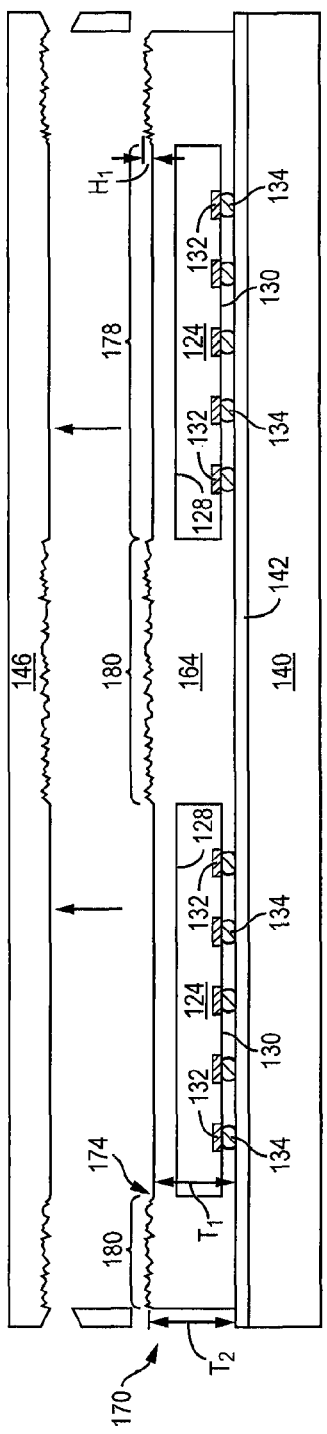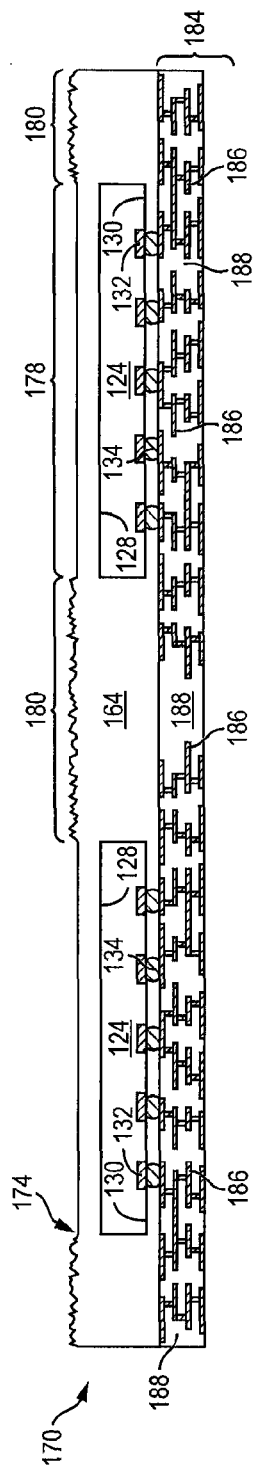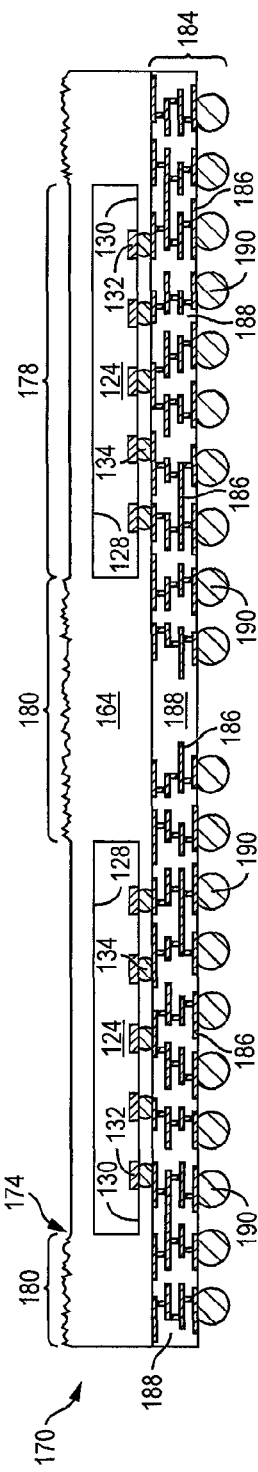

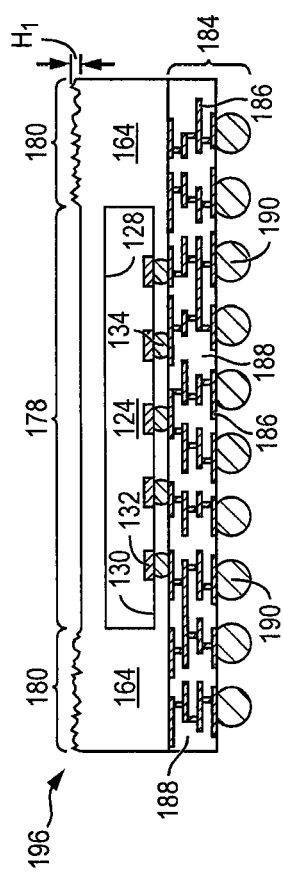
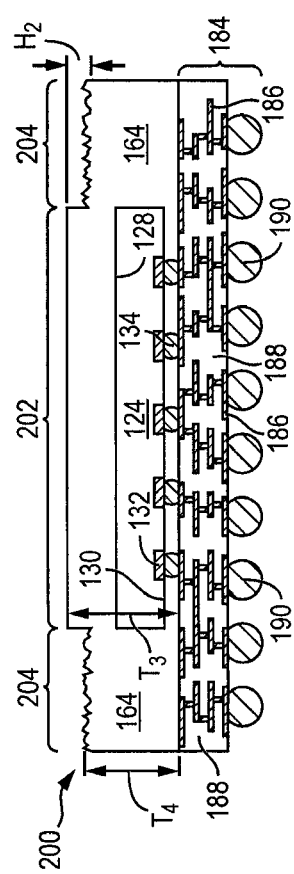
FIG. 5
FIG. 6

_US 9,460,972 B2_

SEMICONDUCTOR DEVICE AND METHOD OF FORMING REDUCED SURFACE ROUGHNESS IN MOLDED UNDERFILL FOR IMPROVED C-SAM INSPECTION

CLAIM OF DOMESTIC PRIORITY

The present application claims the benefit of Provisional Application No. 61/584,634, filed Jan. 9, 2012, which is incorporated herein by reference.

FIELD OF THE INVENTION

The present invention relates in general to semiconductor devices and, more particularly, to a semiconductor device and method of forming reduced surface roughness in molded underfill for improved C-Mode Scanning Acoustic Microscope (C-SAM) inspection.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to reduce a cost of making semiconductor devices. One back-end manufacturing technique employed to reduce the cost of semiconductor devices is the use of a molded underfill (MUF) process instead of a capillary underfill process (CUF). CUF is traditionally used as a first step in a two step process to fill a gap between a semiconductor die and a package substrate using an underfill material. Second, an encapsulant material is used to over mold or encapsulate the semiconductor die and package substrate. On the other hand, MUF is a simpler and more cost effective process that uses a single step approach to both underfill and over mold a semiconductor die in a single encapsulating process. After a semiconductor device has been encapsulated with MUF, the semiconductor device is inspected to detect flaws or defects within the device in order to eliminate potentially unreliable parts and to maintain quality assurance. One defect that occurs in semiconductor devices having undergone a MUF process is the formation of voids in the MUF or encapsulant around the semiconductor die. Another defect is the formation of cracks between bump structures and a dielectric layer, including low dielectric constants (low-k) cracks, which are commonly referred to as "white bumps" due to the appearance of the bumps in an acoustic or sound based scan such as scans using C-SAM. The need to inspect semiconductor devices for voids, cracks, and delamination is also a concern for semiconductor devices including a layer of polyimide (PI) or a PI coated substrate or wafer.

In addressing the goals of both producing smaller semiconductor devices and reducing packaging costs through the use of MUF, detection of defects using C-SAM is problematic. For low profile packages, e.g., packages made with a mold thickness of about 250 μm and with a semiconductor die thickness of about 70 μm, traditional C-SAM methods are unable to detect the presence of voids, white bumps, and low-k cracks. Packages with MUF and formed using a PI coated semiconductor wafer also limit the detection of voids, white bumps, and low-k cracks by traditional C-SAM methods. An inability to identify defects in MUF packages means a reduced ability to eliminate potentially unreliable parts, maintain quality assurance, and reduce semiconductor device failures.

SUMMARY OF THE INVENTION

A need exists for a semiconductor device and method of providing reduced surface roughness in molded underfill for improved acoustic inspection. Accordingly, in one embodiment, the present invention is a method of making a semiconductor device comprising the steps of providing a semiconductor die, forming an interconnect structure over an active surface of the semiconductor die, forming an encapsulant over the semiconductor die and interconnect structure including a first surface opposite the interconnect structure, forming a peripheral portion of the first surface including a first roughness disposed outside a footprint of the semiconductor die, and forming a semiconductor die portion of the first surface including a second roughness less than the first roughness disposed over the footprint of the semiconductor die.

In another embodiment, the present invention is a method of making a semiconductor device comprising the steps of providing a semiconductor die, and forming an encapsulant around the semiconductor die including a peripheral portion disposed outside a footprint of the semiconductor die comprising a first roughness and a die portion disposed over the footprint of the semiconductor die comprising a second roughness less than the first roughness.

In another embodiment, the present invention is a semiconductor device comprising a semiconductor die. An interconnect structure is formed over an active surface of the semiconductor die. An encapsulant is disposed over the semiconductor die and interconnect structure and further includes a first surface opposite the interconnect structure. A peripheral portion of the first surface comprises a first roughness disposed outside a footprint of the semiconductor die. A semiconductor die portion of the first surface comprises a second roughness less than the first roughness disposed over the footprint of the semiconductor die.

In another embodiment, the present invention is a semiconductor device comprising a semiconductor die. An encapsulant is formed around the semiconductor die including a peripheral portion disposed outside a footprint of the semiconductor die comprising a first roughness and a die portion disposed over the footprint of the semiconductor die comprising a second roughness less than the first roughness.

BRIEF DESCRIPTION OF THE DRAWINGS

FIGS. 4a-4h illustrate a process of forming a semiconductor device including molded underfill with a reduced surface roughness;

FIG. 5 illustrates a semiconductor device including molded underfill with a reduced surface roughness; and FIG. 6 illustrates another embodiment of a semiconductor device including molded underfill with a reduced surface roughness.

DETAILED DESCRIPTION OF THE DRAWINGS

Figure 1:
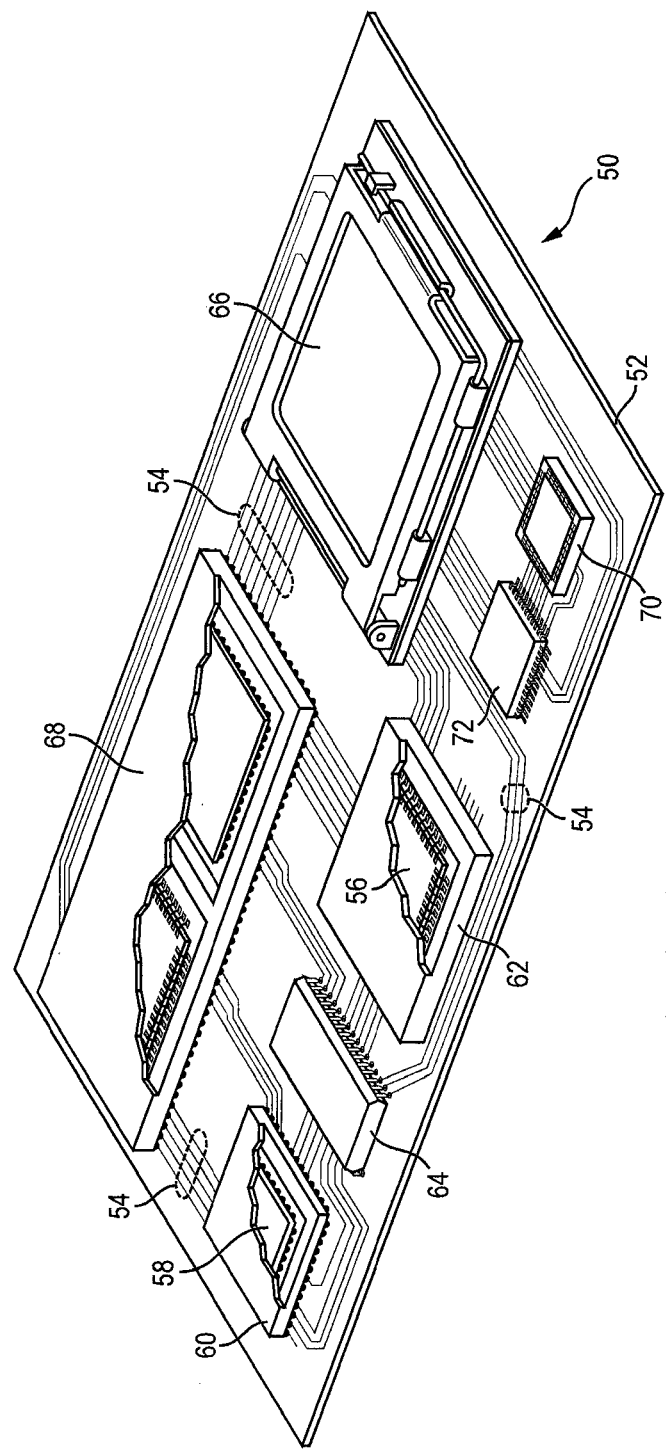
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
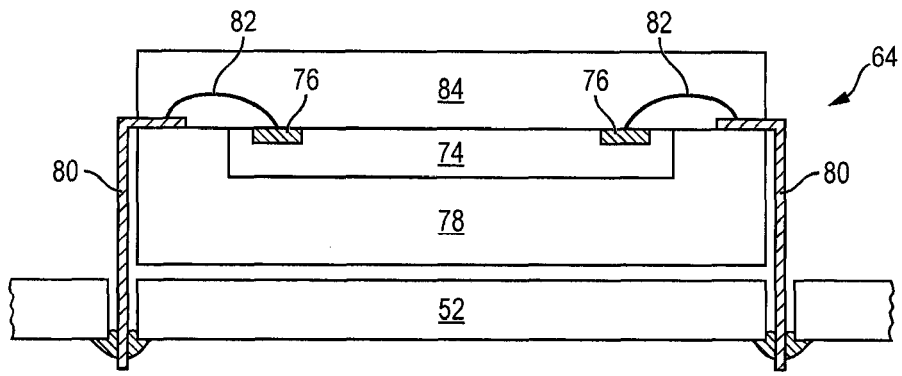
FIGS. 2a-2c illustrate further detail of the representative semiconductor packages mounted to the PCB.
Figure 2B:
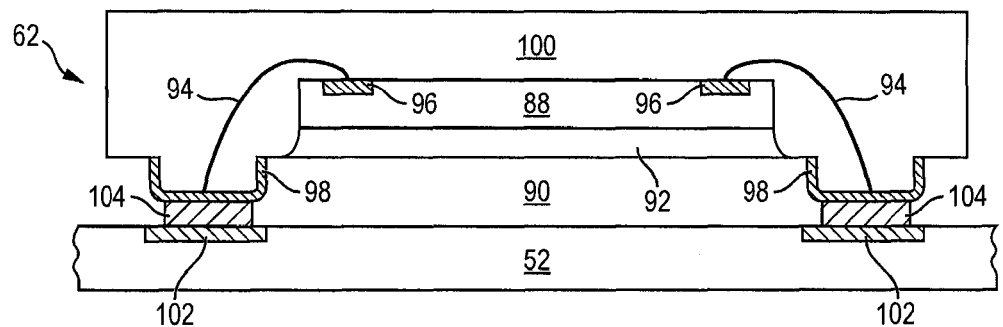
Figure 2C:
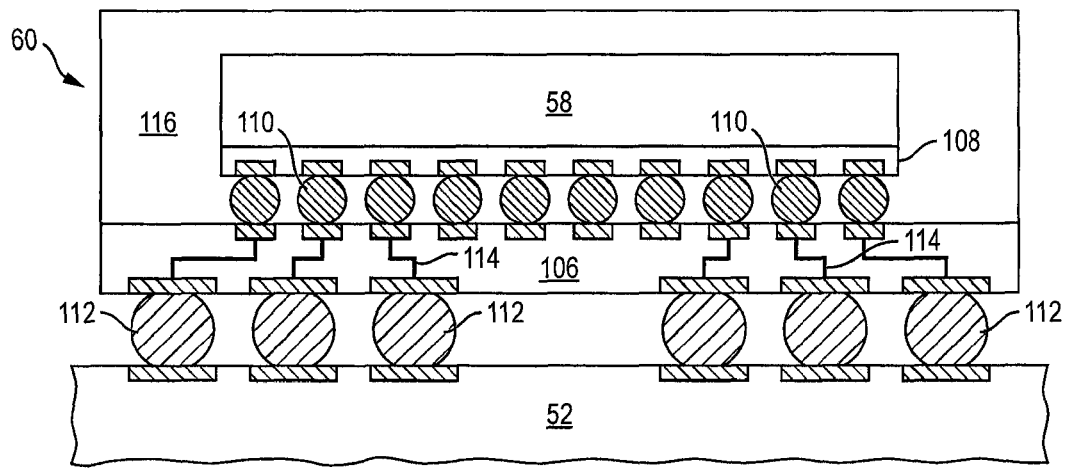

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
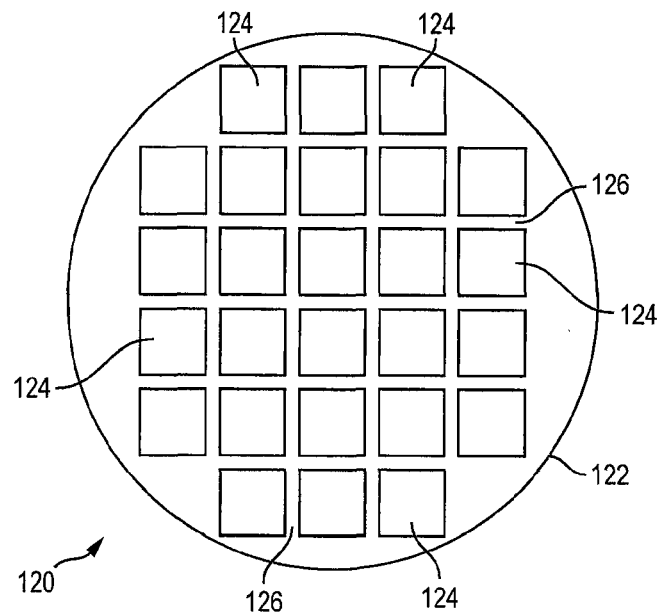
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
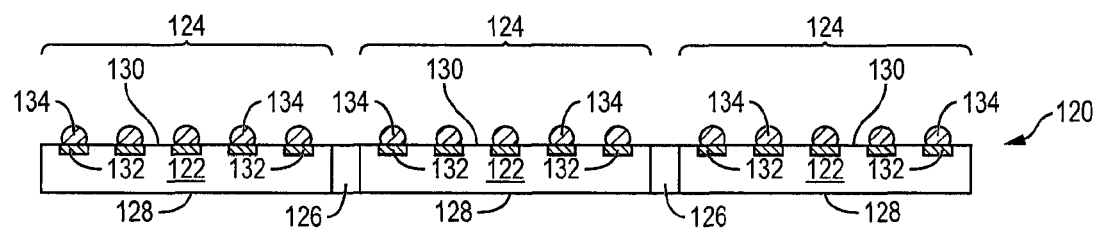

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded or thermocompression bonded to contact pads 132. Bumps 134 represent one type of interconnect structure that can be formed over contact pads 132. The interconnect structure can also use stud bump, micro bump, or other electrical interconnect.

Figure 3C:
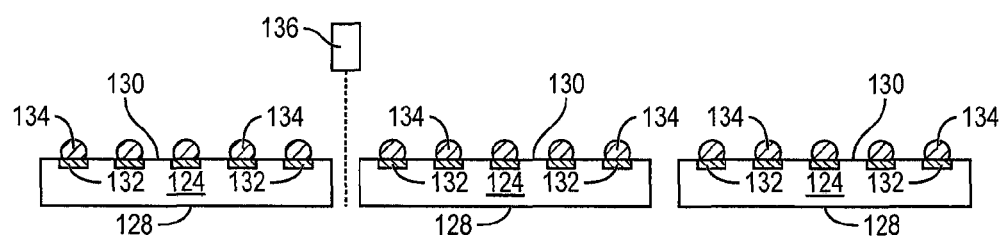

In FIG. 3c, semiconductor wafer 120 is singulated through saw street 126 using a saw blade or laser cutting tool 136 into individual semiconductor die 124.

Figure 4A:
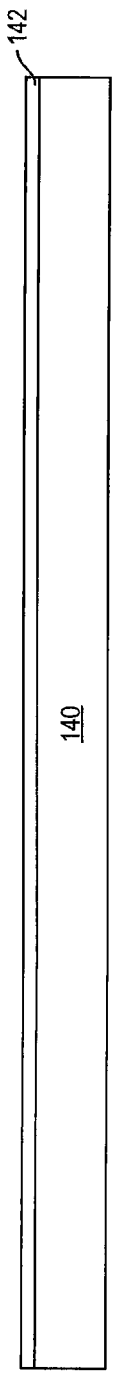

FIGS. 4a-4h illustrate, in relation to FIGS. 1 and 2a-2c, a process of forming a semiconductor device including molded underfill with reduced surface roughness for improved acoustic inspection. FIG. 4a shows a cross-sectional view of a portion of substrate or carrier 140 containing temporary or sacrificial base material such as silicon, germanium, gallium arsenide, indium phosphide, silicon carbide, resin, beryllium oxide, glass, or other suitable low-cost, rigid material for structural support. An interface layer or double-sided tape 142 is formed over carrier 140 as a temporary adhesive bonding film, etch-stop layer, or release layer.

Figure 4B:
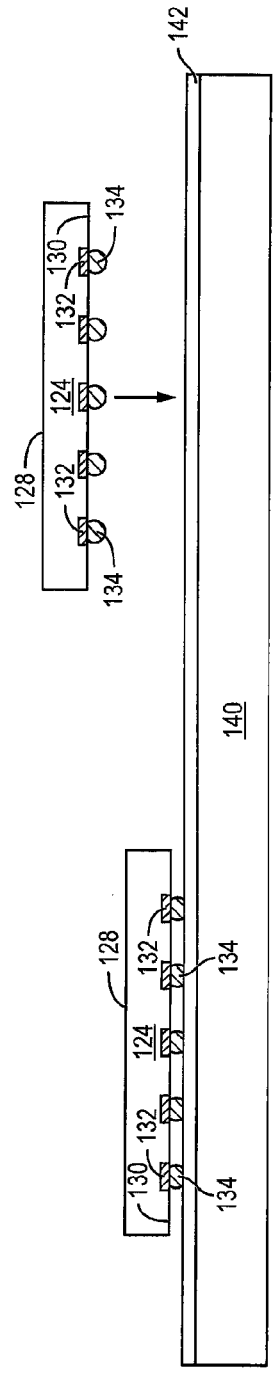

In FIG. 4b, semiconductor die 124 from FIGS. 3a-3c are positioned over and mounted to interface layer 142 and carrier 140 using a pick and place operation with bumps 134 oriented toward the carrier.

Figure 4C:
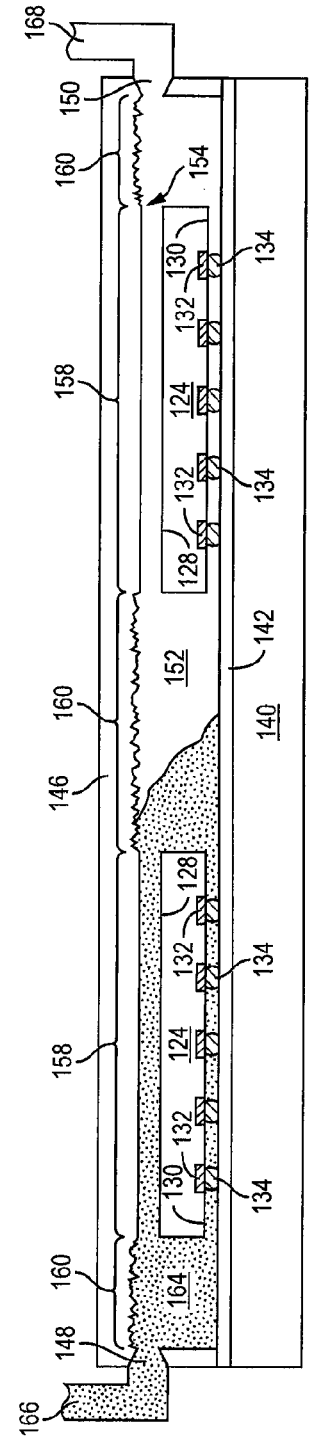

In FIG. 4c, carrier 140 and semiconductor die 124 are placed in chase mold 146 that includes a plurality of inlets 148 and 150, and a cavity 152. Chase mold 146 also has an upper interior surface 154 that forms an upper surface of cavity 152. Upper surface 154 includes a smooth area 158 and a rough area 160. Rough area 160 includes a roughness or offset between high and low regions that is equivalent to a conventional mold roughness. In one embodiment, rough area 160 includes a roughness greater than 1.2 micrometers ($\mu$m), and further includes a roughness in a range of 1.2-1.8 $\mu$m, or in a range of 1.2-1.6 $\mu$m. Smooth area 158 includes a roughness or offset between high and low regions that is less than a roughness of rough area 160. In one embodiment, smooth area 158 includes a roughness less than 1.0 $\mu$m, and in another embodiment a roughness less than 0.5 $\mu$m, and in yet another embodiment a roughness of 0.1 $\mu$m. Smooth area 158 is formed by reducing a roughness of mold surface 154 by either changing a design of the chase mold, or alternatively, by grinding a portion of mold surface 154.

Carrier 140 is placed into chase mold 146 so that semiconductor die 124 are disposed within cavity 152 and upper surface 154 of cavity 152 is disposed over back surface 128 of semiconductor die 124. Smooth area 158 is disposed over semiconductor die 124 and includes a footprint with an area that is larger than, or equal to, an area of a footprint of the semiconductor die. Rough area 160 is formed around, and disposed outside a footprint of, smooth area 158 such that the rough area is disposed over an area that extends between semiconductor die 124. Because smooth area 158 is disposed over semiconductor die 124, a pattern and design of mold 146, including the configuration and location of smooth areas 158, will vary according to the size and number of semiconductor die 124 disposed within the mold. Thus, smooth areas 158 are specifically formed in upper surface 154 of mold 146 to align with a footprint of semiconductor die 124. As such, reconstituted wafers including a different number or size of semiconductor die undergoing MUF with similar mold or encapsulant thicknesses might not use a common mold. Instead, different molds with smooth areas sized according to a size, footprint, and a number of semiconductor die will be used.

After carrier 140 is placed into chase mold 146, a volume of encapsulant or molding compound 164 is injected from dispenser 166 under an elevated temperature and pressure through inlet 148 into cavity 152, over and around semiconductor die 124, and over carrier 140. Inlet 150 can be an exhaust port with optional vacuum assist 168 for excess encapsulant 164. Encapsulant 164 can be a polymer composite material, such as epoxy resin with filler, epoxy acrylate with filler, or polymer with proper filler. Encapsulant 164 is non-conductive, provides physical support, and environmentally protects semiconductor die 124 from external elements and contaminants. A volume of encapsulant 164 is measured according to the space requirements of cavity 152 less the area occupied by semiconductor die 124 and bumps 134. Encapsulant 164 is evenly dispersed and uniformly distributed under an elevated temperature within cavity 152 and around semiconductor die 124. Alternatively, encapsulant 164 is formed using compressive molding, transfer molding, or other suitable applicator. By applying encapsulant 164 in MUF process such that encapsulant 164 is formed over both back surface 128 and active surface 130, a need for an underfill process and a separate encapsulation process is eliminated. As a result, semiconductor die 124 are efficiently enclosed within encapsulant 164 in a single processing step that simplifies manufacturing and reduces cost. Furthermore, as discussed in greater detail below, portions of encapsulant 164 in contact with surface 154 of chase mold 146 are formed with a texture or roughness that is equal to, and mirrors, a roughness of the mold.

In FIG. 4d, semiconductor die 124 and encapsulant 164 are removed from mold 146 as composite substrate or reconstituted wafer 170. Reconstituted wafer 170 includes an upper surface 174 that includes a smooth semiconductor die area 178 and a rough peripheral area 180. A roughness of semiconductor die area 178 and peripheral area 180 is determined by a roughness of mold 146, i.e., by smooth area 158 and rough area 160, respectively. Peripheral area 180 includes a roughness that is equal to, or substantially equal to, a roughness of rough area 160, which is the roughness of a conventional mold. In one embodiment, peripheral area 180 includes a roughness greater than 1.2 $\mu$m, e.g., in a range of 1.2-1.8 $\mu$m, or in a range of 1.2-1.6 $\mu$m. Smooth semiconductor die area 178 includes a roughness that is less than a roughness of peripheral area 180, and is equal to, or substantially equal to, a roughness of smooth area 158. In one embodiment, semiconductor die area 178 includes a roughness less than 1.0 $\mu$m, and in another embodiment a roughness less than 0.5 $\mu$m, and in yet another embodiment a roughness of 0.1 $\mu$m. Thus, by providing mold 146 with smooth areas 158 disposed over a footprint of semiconductor die 124 before dispensing encapsulant 164, reconstituted wafer 170 is formed with smooth semiconductor die area 178 disposed over a footprint of semiconductor die 124 when encapsulant 164 is dispensed within cavity 152 and around the semiconductor die. A total distance or standoff height H1 extends from a low point of semiconductor die area 178, to a high point of peripheral area 180. In one embodiment, the distance H1 must be less than 10 $\mu$m. Furthermore, semiconductor die area 178 is formed with an average height less than an average height of peripheral area 180 such that the semiconductor die area is formed over a first average thickness T1 of encapsulant 164 while the peripheral portion is formed over a second average thickness T2 of the encapsulant that is greater than T1.

Forming semiconductor die area 178 of reconstituted wafer 170 as part of a MUF process is more productive and practical than grinding a surface of encapsulant 164 after removing the reconstituted wafer from a conventional mold. Thus, the use of mold 146 reduces manufacturing cost and increases production volume. By forming smooth die areas 178 using mold 146 with smooth areas 158 and rough areas 160, the mold is less susceptible to staining and scratching than if an entire upper surface of the mold were made with a smooth or shiny surface. Using a design that is less susceptible to staining and scratching reduces a problem of yield loss when semiconductor package undergo external visual inspection (EVI). Furthermore, use of a mold with both smooth areas 158 and rough areas 160 rather than using a mold with an entire upper surface that is smooth or shiny, i.e., includes a roughness less than 1.0 μm, reduces a problem of encapsulated semiconductor die 124 sticking within the mold. By reducing a number of encapsulated die that stick within the mold, additional cleaning of the mold is reduced and productivity is increased.

In FIG. 4e, carrier 140 and interface layer 142 are removed by chemical etching, mechanical peel-off, CMP, mechanical grinding, thermal bake, laser scanning, or wet stripping to expose bumps 134 and encapsulant 164. A build-up interconnect structure 184 is formed over reconstituted wafer 170 and contacts encapsulant 164 and bumps 134. The build-up interconnect structure 184 includes an electrically conductive layer or redistribution layers (RDL) 186 formed using a patterning and metal deposition process such as sputtering, electrolytic plating, and electroless plating. Conductive layers 186 can be one or more layers of Al, Cu, Sn, Ni, Au, Ag, or other suitable electrically conductive material. Conductive layers 186 are electrically connected to bumps 134. Other portions of conductive layers 186 can be electrically common or electrically isolated depending on the design and function of semiconductor die 124.

The build-up interconnect structure 184 further includes an insulating or passivation layer 188 formed between conductive layers 186 for electrical isolation using PVD, CVD, printing, spin coating, spray coating, sintering or thermal oxidation. The insulating layers 188 contain one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

While FIG. 4e shows build-up interconnect structure 184 is formed over reconstituted wafer 170 after encapsulation of semiconductor die 124 in mold 146, the build-up interconnect structure can also be formed before encapsulation. In one embodiment, build-up interconnect structure 184 is formed over temporary carrier 140 and interface layer 142 before semiconductor die 124 are mounted to the temporary carrier such that the semiconductor die are mounted to the build-up interconnect structure over the temporary carrier. Semiconductor die 124, build-up interconnect structure 184, and temporary carrier 140 are then placed together into mold 146 for the MUF process described above with respect to FIGS. 4c and 4d.

In FIG. 4f, an electrically conductive bump material is deposited over and electrically connected to conductive layer 186 of interconnect structure 184 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form balls or bumps 190. In some applications, bumps 190 are reflowed a second time to improve electrical contact to conductive layer 186. An under bump metallization (UBM) layer can be formed under bumps 190. Bumps 190 can also be compression bonded to conductive layer 186. Bumps 190 represent one type of interconnect structure that can be formed over conductive layer 186. The interconnect structure can also use stud bump, micro bump, or other electrical interconnect.

Figure 4G:
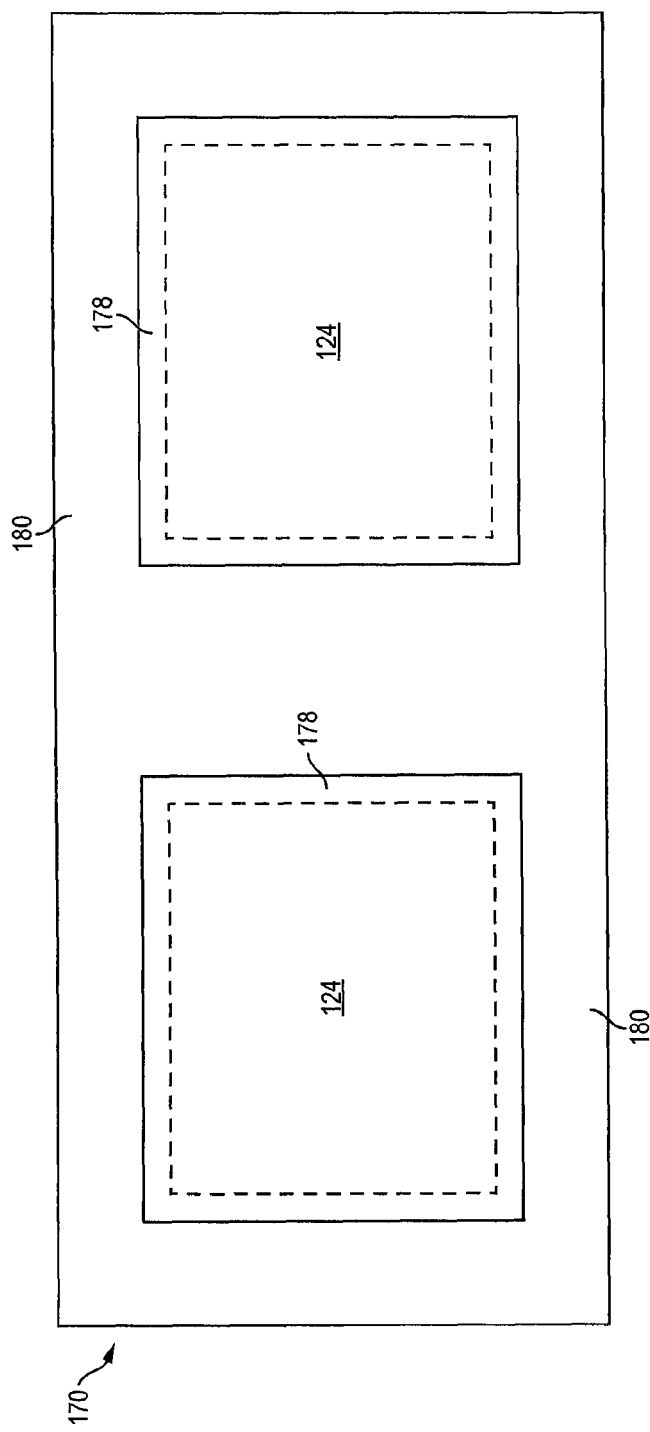

FIG. 4g shows a plan view of reconstituted wafer 170 with a plurality of semiconductor die 124 from FIG. 4f. Specifically, semiconductor die 124 are disposed within a footprint of smooth semiconductor die area 178 of encapsulant 164. By limiting rough peripheral area 180 of encapsulant 164 around, and outside a footprint of, semiconductor die 124, results of acoustic inspection of reconstituted wafer 170 are improved. More specifically, smooth semiconductor die area 178 produces clearer C-SAM images that allow for detection of low-k cracking and the detection of small voids in encapsulant 164 around semiconductor die 124 and bumps 134, e.g., voids including a diameter greater than or equal to approximately 95-100 μm.

Figure 4H:
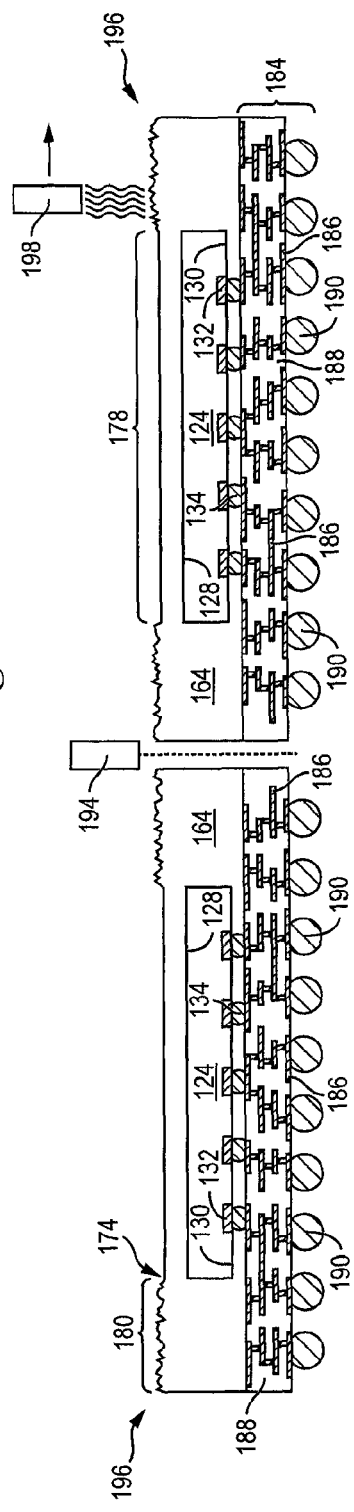

FIG. 4h shows reconstituted wafer 170 together with build-up interconnect structure 184 and bumps 190 singulated through encapsulant 164 and build-up interconnect structure 184 using a saw blade or laser cutting tool 194 into individual semiconductor devices or packages 196.

FIG. 4h also shows an inspection of packages 196 by scanning device 198. The inspection of packages 196 occurs before singulation at the reconstituted wafer level, or alternatively, after singulation into individual packages 196. Scanning device 198 scans packages 196 with acoustic waves or other suitable means to detect voids, cracking, and delamination within the packages. In one embodiment, scanning device 198 is a scanning acoustic tomographic (SAT) device that produces pulses of ultrasound directed to packages 196 and then receives reflected ultrasound that bounces back from the package. Because ultrasound does not transmit through air, the reflected signal received by scanning device 198 includes areas of high contrast resulting from air within packages 196 that allows for the detection of voids, low-k cracking, and delamination within the packages. The ability to screen semiconductor packages encapsulated by a MUF process for voids or other defects is an important factor for ensuring semiconductor package quality. When voids in MUF cannot be detected during inspection, the use of MUF for semiconductor packaging is considered a less viable manufacturing process because quality of the semiconductor packages cannot be measured.

The reflected signal received by scanning device 198 used to detect voids and defects in semiconductor packages 196 is affected by a roughness of package surface 174 and a package thickness or profile. Quality of the reflected signal received by scanning device 198 used to detect defects in packages 196 decreases along with a decrease in package thickness. For packages formed with a mold thickness of 450-530 μm and semiconductor die with a thickness of 150-280 μm, SAT images produced with frequencies of 110 MHz and a focal length of 8 mm included a resolution sufficient to detect a minimum void size of approximately 150 μm in diameter. For lower profile packages including packages formed with a mold thickness of approximately 250 μm, a semiconductor die thickness of 70 μm, and a conventional package surface roughness of about 1.8 μm, C-SAM images produced at frequencies of 110 MHz and 180 MHz do not effectively identify voids, and as such, are not a viable screening process for identifying voids in packages with MUF. One reason why voids are not detected in the lower profile packages is because sonic noise caused by surface roughness of MUF reduces quality of the reflected signal, thereby preventing the detection of voids with C-SAM. By reducing the roughness of encapsulant upper surface 174 in semiconductor die area 178 to less than 1.0 μm or 0.5 μm, a clearer higher quality C-SAM image is produced that allows for the detection of voids, cracks, and delamination that would otherwise remain undetected, especially in low profile MUF packages. By forming semiconductor die area 178 with a surface roughness of 0.1 µm, voids with a minimum diameter of 95-100 µm are reliably detected, making MUF a viable process choice for lower profile packages including a mold thickness of about 250 µm and a semiconductor die thickness of about 70 µm. The detection of voids with a minimum diameter of 95-100 µm is even possible when a PI layer, e.g., a PI layer of 5 µm, is present as part of semiconductor package 196.

Furthermore, by forming semiconductor die area 178 with a surface roughness of 0.1 µm, C-SAM imaging performed at a frequency of 180 MHz at a focal length of 3 millimeters detected the presence of an inter layer dielectric (ILD) crack within a tested semiconductor package. To the contrary, C-SAM imaging on semiconductor packages that included a conventional MUF surface with a roughness of 1.8 µm did not detect the presence of ILD cracking at either 110 MHz or 180 MHz. Accordingly, in one embodiment, SAT inspection is performed unit by unit at a frequency of 180 MHz, which is very sensitive to strip warpage and improves detection of ILD cracking and strip warpage during inspection.

FIG. 5 shows a cross-sectional view of semiconductor package 196 after singulation from reconstituted wafer 170. Semiconductor package 196 is a thin package including MUF or encapsulant 164 and offers a number of advantages over packages known in the prior art.

Specifically, semiconductor packages 196 includes molded underfill with reduced surface roughness for improved acoustic inspection of the semiconductor package. Semiconductor package 196 is formed by mounting semiconductor die 124 to carrier 140 and placing the semiconductor die into chase mold 146 to undergo a MUF process. Chase mold 146 includes smooth area 158 and rough area 160. Encapsulant 164 is injected into chase mold 146 and is disposed over and around semiconductor die 124 and over carrier 140 to form reconstituted wafer 170. Reconstituted wafer 170 includes an upper surface 174 that includes a smooth semiconductor die area 178 and a rough peripheral area 180 that results from encapsulant 164 contacting smooth area 158 and rough area 160, respectively. Peripheral area 180 includes a roughness in a range of 1.2-1.8 µm, and smooth semiconductor die area 178 includes a roughness that is less than 1.0 µm. A build-up interconnect structure 184 and bumps 190 are disposed over reconstituted wafer 170. Interconnect structure 184 is formed over reconstituted wafer 170 before or after encapsulation of semiconductor die 124.

As part of reconstituted wafer 170, semiconductor die 124 are disposed within a footprint of smooth semiconductor die area 178 of encapsulant 164. A decreased roughness of smooth semiconductor die area 178 produces clearer C-SAM images that allow for detection of low-k cracking and the detection of voids in encapsulant 164 around semiconductor die 124 and around bumps 134. In one embodiment, detectable voids include a diameter greater than approximately 95-100 µm. The ability to screen semiconductor packages encapsulated by a MUF process for voids or other defects is an important factor for ensuring semiconductor package quality. By forming semiconductor die area 178 with a surface roughness less than 1.0 µm, including a roughness of 0.1 µm, voids with a minimum diameter of 95-100 µm are reliably detected, making MUF a viable process choice for lower profile packages including a mold thickness of about 250 µm and a semiconductor die thickness of about 70 µm. The detection of voids with a minimum diameter of 95-100 µm is even possible when a PI layer, e.g., a PI layer of 5 µm, is present as part of semiconductor package 196. Furthermore, by forming semiconductor die area 178 with a surface roughness of 0.1 µm, C-SAM imaging can also detect the presence of an ILD crack within a tested semiconductor package.

FIG. 6 shows a cross-sectional view of semiconductor device or package 200, which is similar to semiconductor package 196 from FIG. 5 and is formed by a process similar to the process shown in FIGS. 4a-4h. Semiconductor package 200 is a thin package including MUF or encapsulant 164 having a reduced surface roughness for improved acoustic inspection of the semiconductor package. Semiconductor die area 202 and a rough peripheral area 204 each include a roughness similar to a roughness of semiconductor die area 178 and a peripheral area 180, respectively, such that a roughness or offset between high and low regions of semiconductor die area 202 is less than a roughness or offset between high and low regions of peripheral area 204. Semiconductor die area 202 includes a roughness less than 1.0 µm, and in another embodiment a roughness less than 0.5 µm, and in yet another embodiment a roughness of 0.1 µm. Similarly, peripheral area 204 includes a roughness greater than 1.2 µm, e.g., in a range of 1.2-1.8 µm, or in a range of 1.2-1.6 µm. A footprint of semiconductor die area 202 includes an area greater than or equal to an area of the footprint of semiconductor die 124 such that a footprint of semiconductor die 124 is disposed substantially or completely within a footprint of semiconductor die area 202.

Semiconductor package 200 differs from semiconductor package 196 by a relative orientation of smooth semiconductor die area 202 and rough peripheral area 204 that results from encapsulant 164 contacting a smooth area and a rough area of a chase mold used for the MUF process of encapsulation of semiconductor die 124. In semiconductor package 200, semiconductor die area 202 is formed with a height greater than a height of peripheral area 204. As such, semiconductor die area 202 is formed over a first average thickness of encapsulant T3 while peripheral portion 204 is formed over a second average thickness of the encapsulant T4 that is less than T3. A height or distance H2 extends between a high point on protruded semiconductor die area 202 and low point on peripheral area 204. In one embodiment, height H2 is less than 10 µm.

By forming semiconductor die area 202 with a surface roughness less than 1.0 µm, including a roughness of 0.1 µm, voids with a minimum diameter of 95-100 µm are reliably detected, making MUF a viable process choice for lower profile packages including a mold thickness of about 250 µm and a semiconductor die thickness of about 70 µm. The detection of voids with a minimum diameter of 95-100 µm is even possible when a PI layer, e.g., a PI layer of 5 µm, is present as part of semiconductor package 200. Furthermore, by forming semiconductor die area 202 with a surface roughness of 0.1 µm, C-SAM imaging performed at a frequency of 180 MHz at a focal length of 3 millimeters can detect the presence of an ILD crack within a tested semiconductor package. Accordingly, the formation of semiconductor package 200 allows for the use of MUF and package inspection using acoustic or C-SAM imaging to detect flaws or defects and eliminate potentially unreliable packages to maintain package quality.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor die including an active surface and back surface opposite the active surface of the semiconductor die;
an interconnect structure formed over the active surface of the semiconductor die; and
an encapsulant formed over the semiconductor die with a first exterior surface of the encapsulant contacting the interconnect structure and a second exterior surface of the encapsulant opposite the first exterior surface, wherein the second exterior surface of the encapsulant comprises a first roughness and a first average thickness outside a footprint of the semiconductor die and a second roughness and a second average thickness over the back surface of the semiconductor die including a difference between a high region and low region of less than 1.0 micrometers, the first average thickness of the encapsulant greater than the second average thickness of the encapsulant, and a surface of the semiconductor device coplanar with the second exterior surface of the encapsulant being electrically isolated from the interconnect structure.

2. The semiconductor device of claim 1, wherein a difference between the first average thickness and second average thickness is less than or equal to 10 micrometers.

3. The semiconductor device of claim 1, wherein the first roughness is offset from the second roughness by less than ten micrometers.

4. A semiconductor device, comprising:
a semiconductor die;
an interconnect structure formed over the semiconductor die; and
an encapsulant formed over and around the semiconductor die, wherein a surface of the encapsulant opposite the interconnect structure comprises a first portion including a first surface roughness and a first average thickness around the semiconductor die and a second portion including a second surface roughness and a second average thickness over the semiconductor die, the second surface roughness less than the first surface roughness and the first average thickness of the encapsulant greater than the second average thickness of the encapsulant.

5. The semiconductor device of claim 4, wherein a difference between the first average thickness and second average thickness is less than or equal to 10 micrometers.

6. The semiconductor device of claim 4, wherein the second surface roughness includes a difference between a high region and low region of less than 1.0 micrometers.

7. The semiconductor device of claim 4, wherein the first surface roughness includes a difference between a high region and low region of greater than 1.2 micrometers.

8. The semiconductor device of claim 4, wherein the interconnect structure is formed over an active surface of the semiconductor die.

9. The semiconductor device of claim 4, wherein the first surface roughness is offset from the second surface roughness by less than ten micrometers.

10. A semiconductor device, comprising:
a semiconductor die including an active surface and a back surface opposite the active surface; and
an encapsulant formed over and around the semiconductor die, wherein a surface of the encapsulant covers the back surface of the semiconductor die and comprises a first roughness and a first average thickness around the semiconductor die and a second roughness different from the first roughness and a second average thickness over the back surface of the semiconductor die, the first average thickness of the encapsulant greater than the second average thickness of the encapsulant.

11. The semiconductor device of claim 10, wherein a difference between the first average thickness and second average thickness is less than or equal to 10 micrometers.

12. The semiconductor device of claim 10, wherein the second roughness includes a difference between a high region and low region of less than 1.0 micrometers.

13. The semiconductor device of claim 10, wherein the first roughness includes a difference between a high region and low region of the first roughness of greater than 1.2 micrometers.

14. The semiconductor device of claim 10, further including an interconnect structure formed over the active surface of the semiconductor die.

15. The semiconductor device of claim 10, further including a plurality of bumps formed over the semiconductor die.

16. The semiconductor device of claim 10, wherein the first roughness is offset from the second roughness by less than ten micrometers.

* * * * *